United States Patent
Leibowitz et al.

(10) Patent No.: US 10,764,093 B2
(45) Date of Patent: Sep. 1, 2020

(54) DFE MARGIN TEST METHODS AND CIRCUITS THAT DECOUPLE SAMPLE FEEDBACK TIMING

(71) Applicant: Rambus Inc., Sunnyvale, CA (US)

(72) Inventors: Brian S. Leibowitz, San Francisco, CA (US); Bruno W. Garlepp, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 435 days.

(21) Appl. No.: 15/165,134

(22) Filed: May 26, 2016

(65) Prior Publication Data
US 2016/0344577 A1 Nov. 24, 2016

Related U.S. Application Data

(63) Continuation of application No. 12/558,133, filed on Sep. 11, 2009, now abandoned, which is a continuation of application No. 11/413,584, filed on Apr. 28, 2006, now Pat. No. 7,590,175, which is a continuation-in-part of application No. 10/815,604, filed on Mar. 31, 2004, now Pat. No. 7,627,029, (Continued)

(51) Int. Cl.
| | |
|---|---|
| *H04L 25/03* | (2006.01) |
| *H04L 1/24* | (2006.01) |
| *G01R 31/317* | (2006.01) |
| *H04L 1/20* | (2006.01) |
| *H04L 7/033* | (2006.01) |
| *H04J 11/00* | (2006.01) |
| *H04L 5/00* | (2006.01) |

(52) U.S. Cl.
CPC .. *H04L 25/03057* (2013.01); *G01R 31/31709* (2013.01); *G01R 31/31711* (2013.01); *H04J 11/0023* (2013.01); *H04L 1/20* (2013.01); *H04L 1/241* (2013.01); *H04L 1/242* (2013.01); *H04L 1/244* (2013.01); *H04L 5/006* (2013.01); *H04L 7/033* (2013.01); *H04L 25/03146* (2013.01)

(58) Field of Classification Search
CPC .................................................. H04L 25/03057
USPC ............................................................. 375/233
See application file for complete search history.

(56) References Cited

U.S. PATENT DOCUMENTS

| | | | |
|---|---|---|---|
| 4,060,792 A | 11/1977 | van Heyningen | |
| 4,149,038 A | 4/1979 | Pitroda et al. | |

(Continued)

FOREIGN PATENT DOCUMENTS

| | | |
|---|---|---|
| DE | 10241848 A | 3/2004 |
| EP | 1127423 | 8/2001 |
| WO | WO-2002-093821 | 11/2002 |

OTHER PUBLICATIONS

U.S. Appl. No. 10/441,461, filed May 20, 2003, Chen, Fred F.
(Continued)

*Primary Examiner* — Lihong Yu
(74) *Attorney, Agent, or Firm* — Silicon Edge Law Group LLP; Arthur J. Behiel

(57) ABSTRACT

Described are methods and circuits for margin testing digital receivers. These methods and circuits prevent margins from collapsing in response to erroneously received data, and can thus be used in receivers that employ historical data to reduce intersymbol interference (ISI). Some embodiments allows feedback timing to be adjusted independent of the sample timing to measure the effects of some forms of phase misalignment and jitter.

15 Claims, 11 Drawing Sheets

Related U.S. Application Data which is a continuation-in-part of application No. 10/441,461, filed on May 20, 2003, now Pat. No. 7,408,981.

(56) References Cited

U.S. PATENT DOCUMENTS

| | | | |
|---|---|---|---|
| 4,285,046 A * | 8/1981 | Henry | G06F 17/15 |
| | | | 700/282 |
| 4,456,922 A | 6/1984 | Balaban et al. | |
| 4,475,210 A | 10/1984 | Couch | |
| 4,573,170 A | 2/1986 | Melvin, Jr. et al. | |
| 4,606,052 A | 8/1986 | Hirzel et al. | |
| 4,695,969 A | 9/1987 | Sollenberger | |
| 4,756,011 A | 7/1988 | Cordell | |
| 4,864,590 A * | 9/1989 | Arnon | H04L 25/03146 |
| | | | 333/18 |
| 5,191,462 A | 3/1993 | Gitlin et al. | |
| 5,331,663 A | 7/1994 | Kurokami | |
| 5,367,476 A | 11/1994 | Elliott | |
| 5,475,710 A | 12/1995 | Ishizu et al. | |
| 5,499,268 A | 3/1996 | Takahashi | |
| 5,506,874 A | 4/1996 | Izzard et al. | |
| 5,539,774 A | 7/1996 | Nobakhl et al. | |
| 5,587,709 A | 12/1996 | Jeong | |
| 5,602,602 A | 2/1997 | Hulyalkar | |
| 5,636,249 A | 6/1997 | Roither | |
| 5,761,216 A | 6/1998 | Sotome | |
| 5,850,422 A | 12/1998 | Chen | |
| 5,896,391 A | 4/1999 | Solheim et al. | |
| 5,896,392 A | 4/1999 | Ono et al. | |
| 5,917,856 A | 6/1999 | Torsti | |
| 5,949,819 A | 9/1999 | Bjarnason et al. | |
| 5,966,262 A | 10/1999 | Brickner et al. | |
| 6,005,731 A | 12/1999 | Foland, Jr. et al. | |
| 6,016,379 A | 1/2000 | Bulow | |
| 6,052,248 A | 4/2000 | Reed et al. | |
| 6,055,119 A | 4/2000 | Lee | |
| 6,057,730 A | 5/2000 | Yamamoto | |
| 6,100,834 A * | 8/2000 | Lewyn | H03M 1/208 |
| | | | 341/155 |
| 6,111,831 A | 8/2000 | Alon et al. | |
| 6,178,213 B1 | 1/2001 | McCormack et al. | |
| 6,201,829 B1 | 3/2001 | Schneider | |
| 6,252,536 B1 | 6/2001 | Johnson et al. | |
| 6,295,152 B1 | 9/2001 | Wedding | |
| 6,307,696 B1 | 10/2001 | Bishop et al. | |
| 6,307,884 B1 | 10/2001 | Du et al. | |
| 6,430,715 B1 | 8/2002 | Myers et al. | |
| 6,463,109 B1 | 10/2002 | McCormack | |
| 6,549,595 B1 | 4/2003 | Den Besten et al. | |
| 6,654,926 B1 | 11/2003 | Raphaeli et al. | |
| 6,691,260 B1 * | 2/2004 | Ueno | G11B 20/10009 |
| | | | 375/233 |
| 6,735,710 B1 | 5/2004 | Yoshikawa | |
| 6,762,560 B1 | 7/2004 | Guosheng | |
| 6,798,241 B1 | 9/2004 | Bauer et al. | |
| 6,807,229 B1 | 10/2004 | Kim et al. | |
| 6,864,715 B1 | 3/2005 | Bauer et al. | |
| 6,907,065 B2 | 6/2005 | Kim | |
| 6,947,480 B2 | 9/2005 | Beale et al. | |
| 6,968,134 B1 | 11/2005 | Wiesmann et al. | |
| 6,987,804 B2 | 1/2006 | Buchali et al. | |
| 6,996,202 B2 | 2/2006 | McCormack et al. | |
| 7,010,024 B1 | 3/2006 | Eerola et al. | |
| 7,020,227 B1 | 3/2006 | Wang et al. | |
| 7,058,150 B2 | 6/2006 | Buchwald et al. | |
| 7,099,410 B1 * | 8/2006 | Chennakeshu | H04L 25/03197 |
| | | | 375/341 |
| 7,142,623 B2 | 11/2006 | Sorna | |
| 7,184,477 B2 | 2/2007 | Haunstein et al. | |
| 7,203,257 B2 | 4/2007 | Filmoff et al. | |
| 7,209,525 B2 | 4/2007 | Laturell et al. | |
| 7,292,629 B2 | 11/2007 | Zerbe et al. | |
| 7,363,563 B1 | 4/2008 | Hissen et al. | |
| 7,443,913 B2 | 10/2008 | Bhakta et al. | |
| 7,471,691 B2 | 12/2008 | Black et al. | |
| 7,822,113 B2 | 10/2010 | Tonietto et al. | |
| 8,416,902 B2 | 4/2013 | Kyles et al. | |
| 2001/0016929 A1 | 8/2001 | Bonneau et al. | |
| 2002/0060820 A1 | 5/2002 | Buchali | |
| 2002/0073373 A1 | 6/2002 | Nakao | |
| 2002/0131531 A1 | 9/2002 | Matsumoto et al. | |
| 2003/0002186 A1 | 1/2003 | Bliss et al. | |
| 2003/0058428 A1 | 3/2003 | Jun et al. | |
| 2003/0058970 A1 | 3/2003 | Hamre et al. | |
| 2003/0095619 A1 | 5/2003 | Vallet et al. | |
| 2003/0142740 A1 | 7/2003 | Haunstein et al. | |
| 2003/0223489 A1 | 12/2003 | Smee et al. | |
| 2004/0213504 A1 | 10/2004 | Bryson | |
| 2004/0264615 A1 | 12/2004 | Ho et al. | |
| 2005/0134306 A1 | 6/2005 | Stojanovic et al. | |
| 2006/0067391 A1 | 3/2006 | Garlepp | |
| 2007/0002990 A1 | 1/2007 | Lee et al. | |
| 2007/0147566 A1 | 6/2007 | Laturell et al. | |
| 2008/0037693 A1 | 2/2008 | Andrus et al. | |
| 2009/0019326 A1 | 1/2009 | Boudon et al. | |
| 2011/0169540 A1 | 7/2011 | Kyles et al. | |
| 2012/0224621 A1 | 9/2012 | Stojanovic et al. | |

OTHER PUBLICATIONS

U.S. Appl. No. 10/815,604, filed Mar. 31, 2004, Ho et al.

Granberg, Tom, "Handbook of Digital Techniques for High-Speed Design," Prentice Hall Modern Semiconductor Design Series, Copyright 2004 by Pearson Education, Inc. 12 pages.

Leibowitz, Brian, U.S. Appl. No. 12/558,133, filed Sep. 11, 2009, Office Action dated Jan. 24, 2012. 17 pages.

Leibowitz, Brian, U.S. Appl. No. 12/558,133, filed Sep. 11, 2009, Office Action dated Jun. 26, 2012. 12 pages.

Leibowitz, Brian, U.S. Appl. No. 12/558,133, filed Sep. 11, 2009, Office Action re Restriction Requirement dated Nov. 25, 2011. 6 pages.

Leibowitz, Brian, U.S. Appl. No. 12/558,133, filed Sep. 11, 2009, Response dated Oct. 16, 2012 to the Office Action dated Jun. 26, 2012. 7 pages.

Leibowitz, Brian, U.S. Appl. No. 12/558,133, filed Sep. 11, 2009, Response dated Apr. 17, 2012 to the Office Action dated Jan. 24, 2012. 8 pages.

Leibowitz, Brian, U.S. Appl. No. 12/558,133, filed Sep. 11, 2009, Amendment in Response to Restriction Requirement submitted Dec. 7, 2011. 5 Pages.

LMO Test Systems, Inc., "SHMOO User's Guide," 500 Semiconductor Production Test System, Copyright © 1998-2001, Last Revised Apr. 2001, pp. 1-28. 30 pages.

* cited by examiner

DFE MARGIN TEST METHODS AND CIRCUITS THAT DECOUPLE SAMPLE FEEDBACK TIMING

BACKGROUND

Signal distortion limits the sensitivity and bandwidth of any communication system. A form of distortion commonly referred to as "intersymbol interference" (ISI) is particularly problematic and is manifested in the temporal spreading and consequent overlapping of individual pulses, or "symbols." Severe ISI prevents receivers from distinguishing symbols and consequently disrupts the integrity of received signals.

FIG. 1 (prior art) depicts a conventional receiver 100, which is used here to illustrate the ISI problem and a corresponding solution. Receiver 100 includes a data sampler 105 and a feedback circuit 110. Sampler 105 includes a differential amplifier 115 connected to a decision circuit 120. Decision circuit 120 periodically determines the probable value of signal Din and, based on this determination, produces a corresponding output signal Dout.

Sampler 105 determines the probable value of signal Din by comparing the input signal Din to a voltage reference Vref at a precise instant. Unfortunately, the effects of ISI depend partly on the transmitted data pattern, so the voltage level used to express a given logic level varies with historical data patterns. For example, a series of logic zero signals followed by a logic one signal produces different ISI effects than a series of alternating ones and zeroes. Feedback circuit 110 addresses this problem using a technique known as Decision Feedback Equalization (DFE), which produces a corrective feedback signal that is a function of received historical data patterns.

DFE feedback circuit 110 includes a shift register 125 connected to the inverting input of amplifier 115 via a resistor ladder circuit 130. In operation, receiver 100 receives a series of data symbols on an input terminal Din, the non-inverting input terminal of amplifier 115. The resulting output data Dout from sampler 105 is fed back to shift register 125, which stores the prior three output data bits. (As with other designations herein, Din and Dout refer to both signals and their corresponding nodes; whether a given designation refers to a signal or a node will be clear from the context.)

Shift register 125 includes a number of delay elements, three flip-flops D1-D3 in this example, that apply historical data bits to the reference voltage side of the differential amplifier 115 via respective resistors R1, R2, and R3. The value of each resistor is selected to provide appropriate weight for the expected effect of the corresponding historical bit. In this example, the value of resistor R3 is high relative to the value of resistor R1 because the effect of the older data (D3) is assumed to be smaller than the effect of the newer data (D1). For the same reason, the resistance of resistor R2 is between the resistors R1 and R3. Receiver 100 includes a relatively simple DFE circuit for ease of illustration: practical DFE circuits may sample more or fewer historical data values. For a more detailed discussion of a number of receivers and DFE circuits, see U.S. Pat. No. 6,493,394 to Tamura et al., issued Dec. 10, 2002, which is incorporated herein by reference.

The importance of accurate data reception motivates receiver manufacturers to characterize carefully their system's ability to tolerate ISI and other types of noise. One such test, a so-called "margin" test, explores the range of voltage and timing values for which a given receiver will properly recover input data.

FIG. 2 depicts a fictional eye pattern 200 representing binary input data to a conventional receiver. Eye pattern 200 is graphed in two dimensions, voltage V and time T. The area of eye 205 represents a range of reference voltages and timing parameters within which the data represented by eye 205 will be captured. The degree to which the voltage V and time T of the sampling point can vary without introducing an error is termed the "margin."

FIGS. 3A through 3C depict three signal eyes 300, 305, and 310 illustrating the effects of DFE on margins and margin testing. Referring first to FIG. 3A, eye 300 approximates the shape of eye 205 of FIG. 2 and represents the margin of an illustrative receiver in the absence of DFE. FIG. 3B represents the expanded margin of the same illustrative receiver adapted to include DFE: the DFE reduces the receiver's ISI, and so extends the margins beyond the boundaries of eye 300. Increasing the margins advantageously reduces noise sensitivity and improves bit error rates (BER).

In-system margin tests for a receiver are performed by monitoring receiver output data (e.g., Dout in FIG. 1) while varying the reference voltage and sample timing applied to the input waveform Din. With reference to FIG. 2, such monitoring using various combinations of voltage and time permits detection of the boundaries of eye 205, where the boundaries are indicative of voltage and timing combinations for which the receiver is unable to correctly resolve the bits or symbols in the input waveform Din. Such margin tests thus use detection of the receipt of erroneous data to identify signal margins. Zerbe et al. detail a number of margin tests in "Method and Apparatus for Evaluating and Optimizing a Signaling System," U.S. patent application Ser. No. 09/776,550, which is incorporated herein by reference.

A particular difficulty arises when determining the margins of DFE-equipped receivers. While feeding back prior data bits increases the margin (FIG. 3B), the effect is just the opposite if the feedback data is erroneous. Erroneous feedback emphasizes the ISI and consequently reduces the margin, as shown in FIG. 3C. The margin of a DFE-equipped receiver thus collapses when a margin test begins to probe the limits of the test signal (e.g., the boundaries of eye 205). The incompatible requirements of erroneous data for the margin test and correct data for the DFE thus impede margin testing. There is therefore a need for improved means of margin testing DFE-equipped receivers.

The need for accurate margin testing is not limited to DFE-equipped receivers. Errors in margin testing lead integrated-circuit (IC) designers to specify relatively large margins of error, or "guard bands," to ensure that their circuits will perform as advertised. Unfortunately, the use of overly large margins reduces performance, an obvious disadvantage in an industry where performance is paramount. There is therefore a need for ever more precise methods and circuits for accurately characterizing the margins of high-speed integrated circuits.

DETAILED DESCRIPTION

Figure 4:
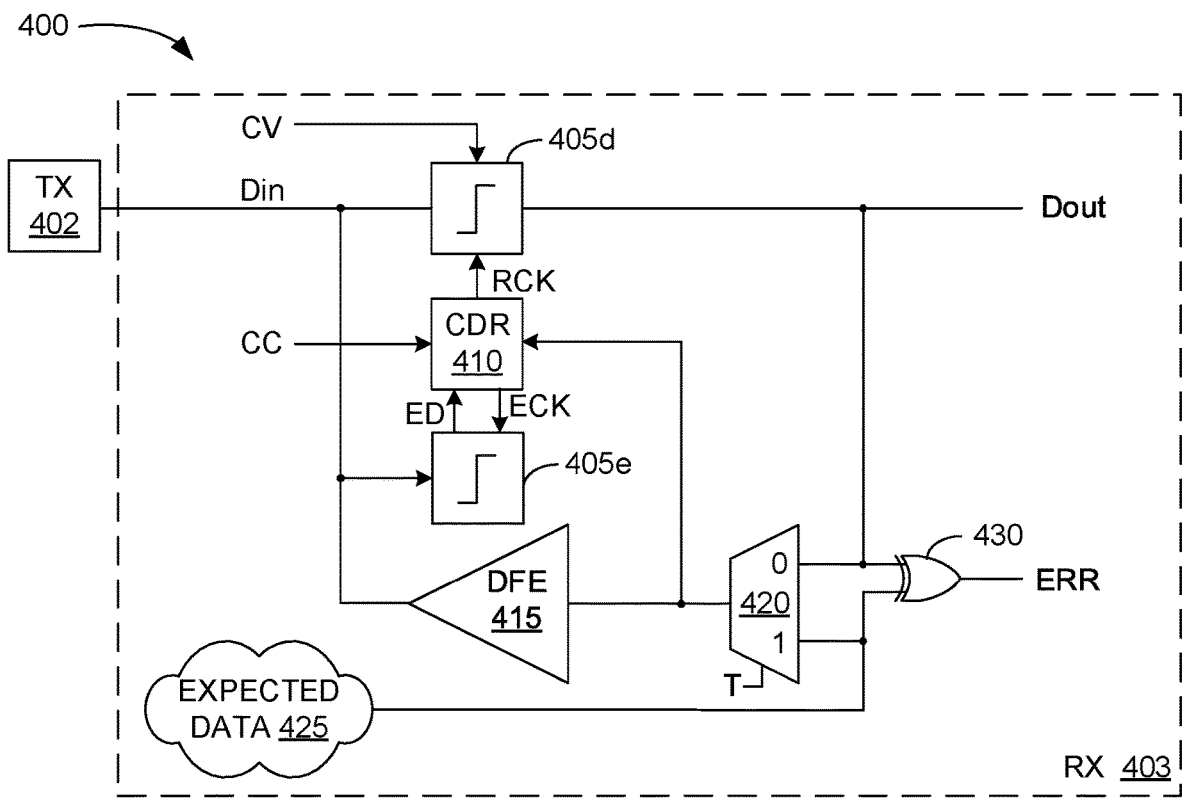
FIG. 4 depicts a communication system 400, including a conventional transmitter 402 connected to a DFE-equipped receiver 403 adapted in accordance with one embodiment.

FIG. 4 depicts a communication system 400, including a conventional transmitter 402 connected to a receiver (receive circuit) 403 equipped with Decision Feedback Equalization (DFE). In a normal operational mode, receiver 403 samples an input data stream from transmitter 402. The sampled data provides DFE feedback to reduce intersymbol interference (ISI). In a margin-test mode, receiver 403 samples a known input data stream using ranges of sample timing and reference voltages. To prevent a collapse of the margins, the DFE feedback path disregards the potentially erroneous sampled data in favor of an identical version of the known input data stream. Such in-system margin tests can therefore probe the margin without collapsing the margin limits.

Receiver 403 conventionally includes respective data and edge samplers 405d and 405e, a clock-and-data recovery (CDR) circuit 410, and a DFE circuit 415. During normal operation, receiver 403 receives a data stream (e.g., a series of data symbols) on sampler input terminal Din. Data sampler 405d samples the data stream using a recovered clock RCK from CDR circuit 410 and produces the resulting sampled data stream on a sampler output terminal Dout. Edge sampler 405e samples the transitions in the data stream using a recovered edge clock ECK from CDR circuit 410 and delivers sampled edge data ED to CDR circuit 410. DFE circuit 415 stores a plurality of prior data samples and uses these to condition the input data in the manner discussed above in connection with FIG. 1. In addition to the conventional components, receiver 403 includes a multiplexer 420, an expected-data source 425, and some comparison logic 430, in this case an exclusive OR (XOR) gate.

During normal operation, a test control signal T to multiplexer 420 is set to a logic zero to connect the output data Dout to the input of DFE 415. Thus configured, receiver 403 acts as a conventional DFE-equipped receiver, and CDR circuit 410 employs the edge data ED and output data Dout to derive sample clock signals RCK and ECK for respective data and edge samplers 405d and 405e. In a margin-test mode, however, select signal T is set to a logic one so as to convey an expected data stream from data source 425 to the input of DFE 415. Transmitter 402 then supplies known test data on terminal Din while the expected data is applied to DFE 415. The expected data is an identical, time-shifted version of the known data applied to input terminal Din, so DFE 415 produces the correct feedback without regard to the output signal Dout. In essence, multiplexer 420 provides the feedback path with a first input terminal for sampled output data in the operational mode and with a second input terminal for expected data in the margin-test mode.

The repeated reference herein to "terminal" Din, as opposed to the plural form "terminals," is for brevity. Receivers may include more than one data-input terminal, such as those that rely upon differential signaling. Likewise, other clock, reference, and signal paths noted herein can be single-ended, differential, etc., as will be evident to those of skill in the art. The preferred manner in which particular test circuits and methods are adapted for use with a given receiver will depend, in part, on the receiver architecture.

A voltage control signal CV on a like-named sampler input terminal alters the reference voltage used by sampler 405 to sample input data. A clock control signal CC to CDR circuit 410 modifies the timing of recovered clock signal RCK. Control signals CV and CC are used in margin testing to explore the voltage and timing margins of receiver 403. When the margin tests reach the margin limits, and thus introduce errors in output signal Dout, expected-data source 425 continues to provide the correct DFE feedback signal and consequently prevents the margins from collapsing in response to the errors. Comparison circuit 430 monitors the sampled-data series for errors by comparing the output data with the expected data from expected-data source 425. In the event of a mismatch, comparison circuit 430 produces a logic one error signal ERR. A sequential storage element (not shown) captures any error signal. Receiver 403 thus facilitates margin testing of DFE-equipped receivers without collapsing the margin of interest.

Expected-data source 425 produces the same data as expected on input terminal Din. Source 425 can be a register in which is previously stored a known data pattern to be provided during margin testing. Source 425 might also be a register that goes through an expected sequence of data, such as a counter or a linear-feedback shift register (LFSR). Regardless of the source, the expected data presents the expected output data, appropriately timed, to the input of the feedback circuit DFE 415.

Figure 5:
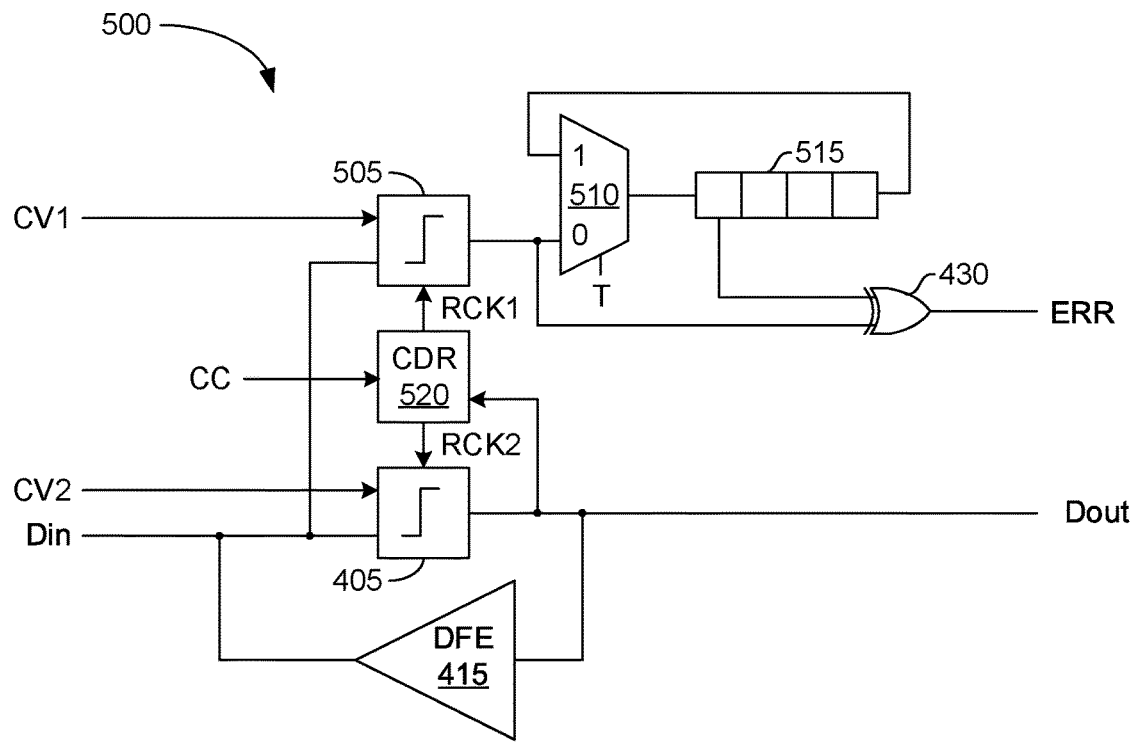
FIG. 5 depicts a DFE-equipped receiver 500 adapted in accordance with an embodiment to include improved means of margin testing.

FIG. 5 depicts a receiver circuit 500 in accordance with another embodiment. Receiver 500 is similar in some ways to receiver 403 of FIG. 4, like-numbered elements being the same. Receiver 500 is extended to include a second sampler 505 that is substantially identical to, and consequently mimics the behavior of, sampler 405. The margin tests are performed on replica sampler 505 so that margin-testing circuitry has little or no impact on the performance of receiver 500 in the operational mode.

Receiver 500 includes a multiplexer 510 connected to a shift register 515. A modified clock and data recovery circuit CDR 520 controls the timing of both samplers 505 and 405. Prior to a margin test, test signal T is set to logic zero and the storage elements within register 515 are loaded with an expected-data sequence. Then, in the test mode, test terminal T is set to logic one so that shift register 515 feeds its output back to its input via multiplexer 510. To perform a margin test, sampler 505 samples input data Din. Comparison circuit 430 compares the resulting samples with the expected-data sequence provided by the first storage element in register 515. Any difference between the data sampled by the replica sampler 505 and the expected sequence from register 515 induces comparison circuit 430 to produce a logic one error signal on line ERR. Clocking circuitry, e.g. within CDR 520, can be adapted to control separately the recovered clock signals RCK1 and RCK2.

Figure 6:
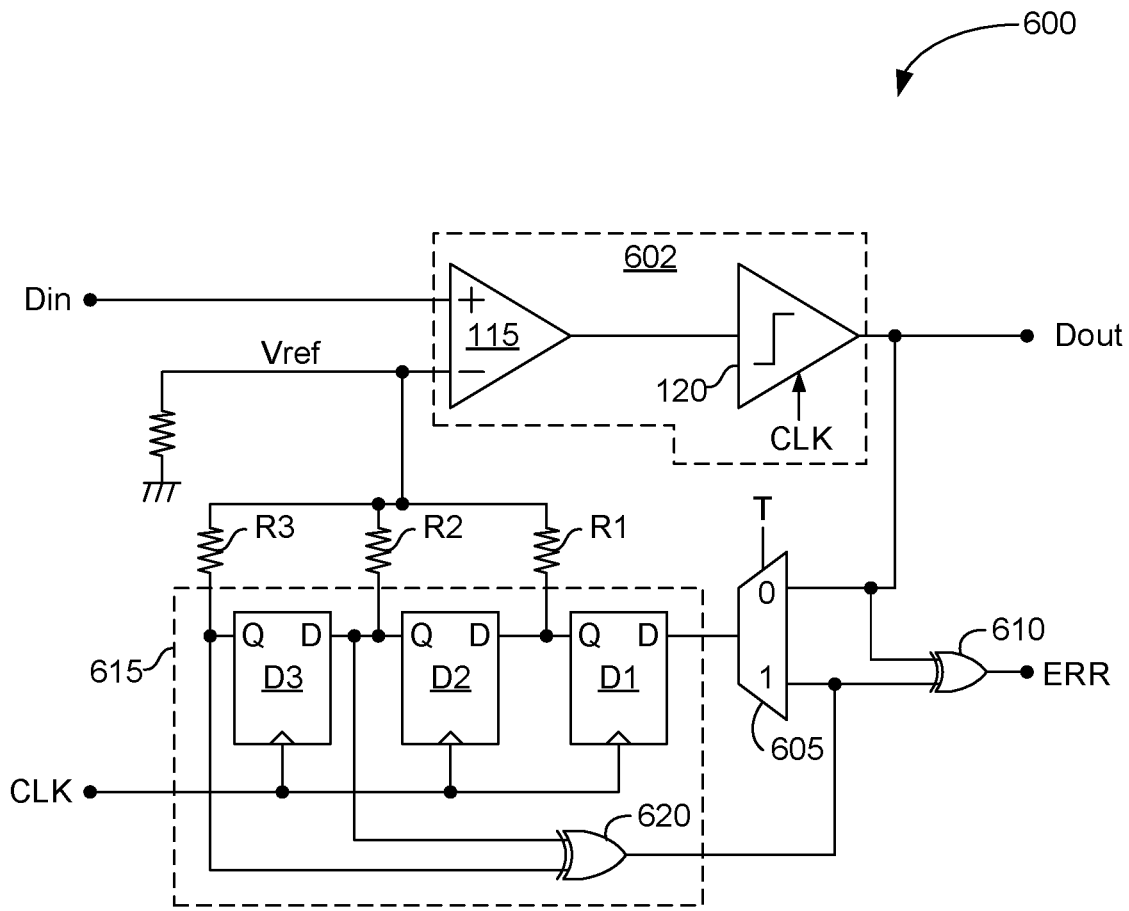
FIG. 6 depicts a receiver 600 in accordance with another embodiment.

FIG. 6 depicts a receiver 600 in accordance with another embodiment. Receiver 600 is similar to the conventional receiver 100 of FIG. 1, but is modified to support improved margin testing.

Figure 1:
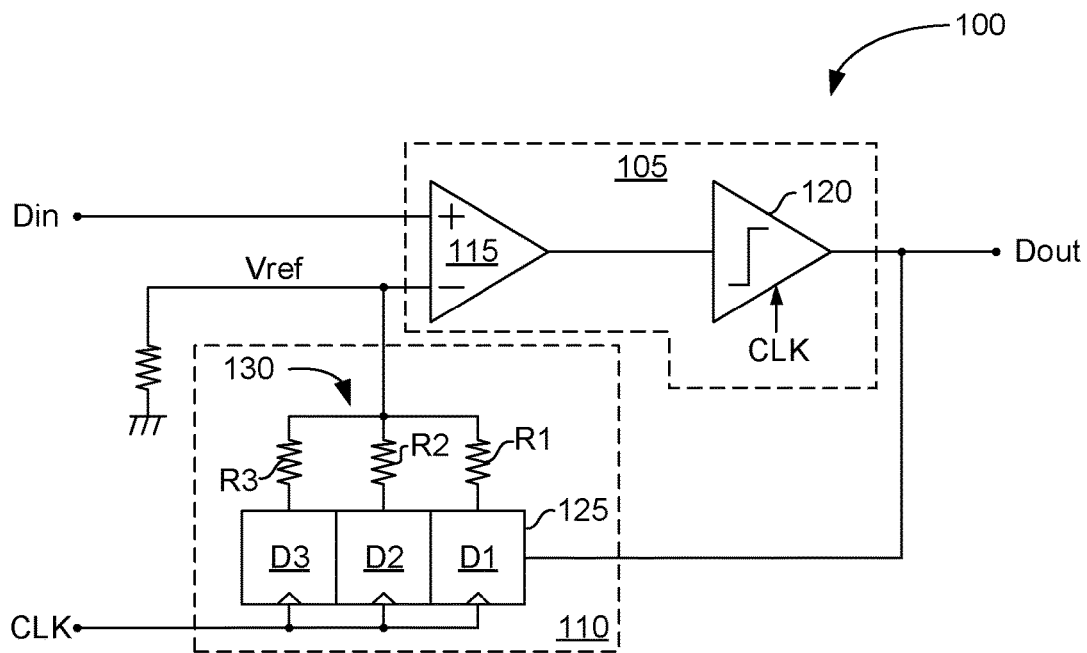
FIG. 1 (prior art) depicts a conventional digital receiver 100.
Figure 2:
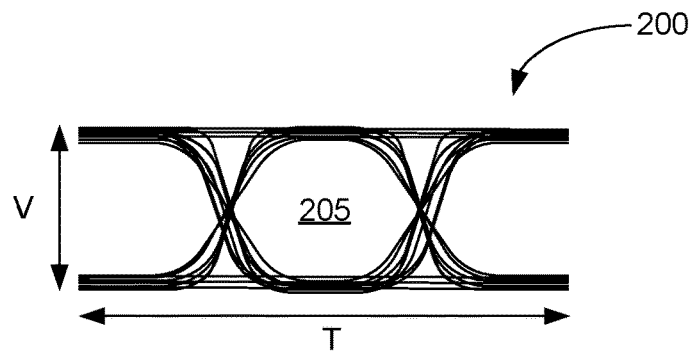
FIG. 2 depicts a fictional eye pattern 200 representing binary input data to a conventional receiver.
Figure 3A:
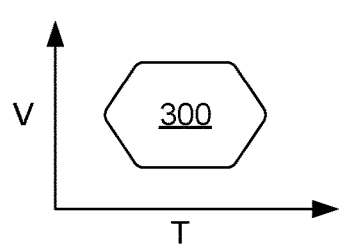
FIGS. 3A through 3C depict three signal eyes 300, 305, and 310 illustrating the effects of DFE on margins and margin testing.
Figure 3B:
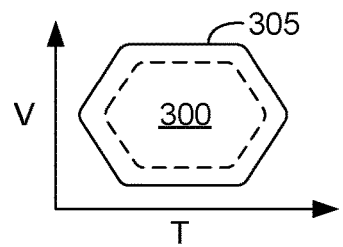
Figure 3C:
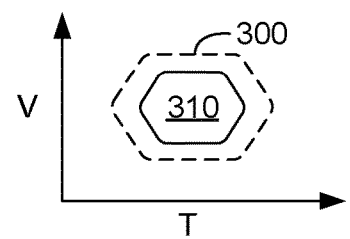

Receiver 600 includes a sampler 602 that, like sampler 105 of FIG. 1, includes a differential amplifier 115 and a decision circuit 120. Although not shown, sampler 602 includes conventional means of adjusting the reference voltage and timing to support margin testing. DFE of receiver 600 performs conventionally in the operational mode and provides expected data in the margin-test mode.

Receiver 600 includes a multiplexer 605, a comparison circuit 610, and a dual-mode register 615. Multiplexer 605 conveys output signal Dout to register 615 in the operational mode. Thus configured, receiver 600 functions analogously to receiver 100 of FIG. 1. That is, register 615 shifts in the output data Dout and employs three bits of historic data to provide ISI-minimizing feedback to sampler 602.

During margin testing, test signal T is set to logic one. In that case, multiplexer 605 provides the output of an XOR gate 620 to the input of register 615. The inclusion of XOR gate 620 and the path through multiplexer 605 converts register 615 into a linear-feedback shift register (LFSR) that provides a pseudo-random but deterministic sequence of bits to both the input of register 615 and comparison circuit 610. Also during the margin test, the same pseudo-random sequence produced by register 615 is provided on input terminal Din. This test sequence is applied one clock cycle ahead of the expected data in flip-flop D1 of register 615, so the DFE will reflect the appropriate data regardless of whether output data Dout is correct. The timing and reference voltage of sampler 602 can therefore be adjusted while monitoring output data Dout for errors without fear of collapsing the margin limits. Comparison circuit 610, an exclusive OR gate in this example, flags any mismatches between the output data and the expected data to identify errors.

In the example of FIG. 6, the pseudo-random sequence of test bits applied to input terminal Din is assumed to come from an external source, such as a conventional tester. The disclosed embodiments can also be adapted to support built-in self test (BIST) or in-system testing. For example, a linked transmitter/receiver pair adapted in accordance with one embodiment can margin test the intervening link. In other embodiments, receiver 600 is modified so that register 615 or another on-chip source provides the input test sequence. In some embodiments, register 615 is extended to include additional storage elements to produce more complex pseudo-random bit sequences. In such cases, the number of outputs from register 615 to the input of sampler 602 can be the same as or different from the number of storage elements employed by the LFSR. For additional details regarding LFSRs, see "What's an LFSR," document no. SCTA036A from Texas Instruments™ (12/1996) and the Xilinx™ application note entitled "Efficient Shift Registers, LFSR Counters, and Long Pseudo-Random Sequence Generators," by Peter Alfke, XAPP 052, 7 Jul. 1996 (Version 1.1), both of which are incorporated herein by reference.

Figure 7:
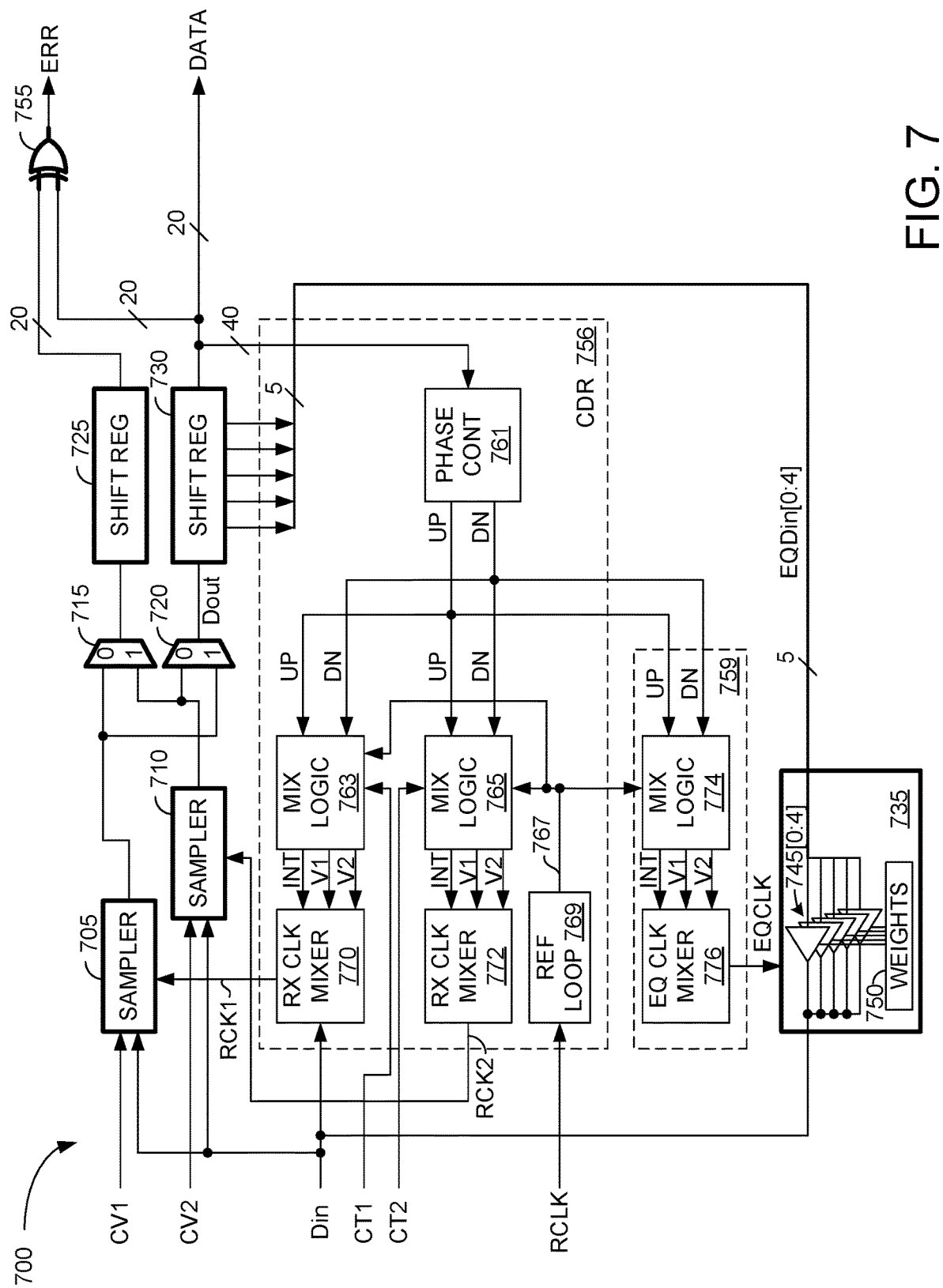
FIG. 7 depicts a receiver 700 in accordance with yet another embodiment.

FIG. 7 depicts a receiver 700 in accordance with yet another embodiment. FIG. 7 includes a number of elements that are incidental to the inventive margin-testing circuitry, and so are only touched upon briefly here. The main components of the margin-testing circuitry are highlighted using bold outlines to distinguish them from incidental features. The emphasized components include a pair of conventional samplers 705 and 710 receiving input data on the same input terminal, Din, a pair of multiplexers 715 and 720, a pair of shift registers 725 and 730, and a data-weighting circuit 735.

In the operational mode, multiplexers 715 and 720 both select their zero input. The input data Din captured by samplers 705 and 710 is thus conveyed to respective shift registers 725 and 730. The data in shift register 730 is the output data DATA of receiver 700, and is fed back to weighting circuit 735. For equalization feedback, all or a subset of the bits stored in the plurality of storage elements that make up shift register 730 are provided to weighting circuit 735. In one embodiment, shift registers 725 and 730 each store twenty bits. Of these, five bits from register 730 are conveyed to weighting circuit 735. The selected bits and their associated weighting are optimized for a given receiver. For a detailed discussion of methods and circuits for performing such optimization, see U.S. application Ser. No. 10/195,129 entitled "Selectable-Tap Equalizer," by Zerbe et al., filed Jul. 12, 2002, which is incorporated herein by reference. The details of that reference pertain to the optimization of a number of novel receivers. The margining methods and circuits disclosed herein may be of use in any systems that employ historical data to reduce ISI.

Weighting circuit 735 produces a weighted sum of a plurality of historical bits and applies this sum to input terminal Din. This is the same general function provided by the DFE ladder circuit of FIG. 1, though the manner in which these weighting circuits perform this function differs significantly.

Weighting circuit 735 includes five amplifiers 745[0:4], each of which receives a bit from shift register 730. A weight-reference circuit 750 provides each amplifier 745 with a reference signal (e.g., a constant current) that determines the weight given to the associated bit. The output terminals of amplifiers 745[0:4] are connected to input terminal Din to provide a weighted sum of five historical data values from shift register 730. A current-controlled embodiment of an amplifier 745[i] is detailed below in connection with FIG. 8.

In the margin-test mode, each of multiplexers 715 and 720 selects its "one" input. The output of sampler 705 is thus conveyed to shift register 730 and the output of sampler 710 is conveyed to shift register 725. Recall that a function of the margin-test mode is to provide expected data to the input of the DFE circuitry. In this case, the expected data is the input data sampled by sampler 705 and captured in shift register 730. A voltage-control signal CV2 and timing control signal CT2 allow a tester or test personnel to alter the reference voltage and received clock RCK2 as necessary to probe the margin boundaries for sampler 710. Similar control signals CV1 and CT1 afford similar control over sampler 705 and are set to appropriate levels to ensure sampler 705 correctly captures the input data.

During a margin test, potentially erroneous data bits from sampler 710 pass through shift register 725. Comparison circuit 755 therefore produces a logic-one error signal on line ERR. In this embodiment, it is not necessary to store expected data in advance or to provide a dedicated source of expected data. Instead, the expected data is derived from input data on terminal Din sampled by sampler 705. The sampler used to produce output data in the operational mode, sampler 710, may be the same type of sampler subjected to the margin test. Testing the receive circuitry, as opposed to a replica, is advantageous because it provides a more accurate reading of the actual receive-circuitry performance. Also important, sampler 705 can be margined in a normal operating mode, assuming that it has independent timing and voltage control relative to sampler 710. Sampler 705 can also be margin tested and the respective sample point (voltage and timing) centered in the data eye prior to margin testing sampler 710.

Receiver 700 of FIG. 7 is an equalizing receiver that generates receive and equalization clock signals. The following discussion outlines various features of receiver 700. For a more detailed discussion of similar receivers, see the above-incorporated application to Zerbe et al.

In addition to the components discussed above in relation to the margin-testing methods and circuits, receiver 700 includes a CDR circuit 756 and an equalizer clock generator 759. Samplers 705 and 710 sample incoming data signal Din in response to respective receive-clock signals RCK1 and RCK2, both of which are derived from a reference clock RCLK. The samples taken by sampler 710 are shifted into register 730, where they are stored for parallel output via output bus DATA to some application logic (not shown) and to CDR circuit 756.

Receive clock signal RCLK may include multiple component clock signals, such as a data clock signal (and in some double data rate implementations, the complement data clock signal, for capturing even and odd phase data samples), and an edge clock signal (and optionally a complement edge clock signal) for capturing edge samples (i.e., transitions of the data signal between successive data eyes). The data and edge samples are shifted into shift registers 725 and 730. Samples in register 730 are then supplied as parallel words (i.e., a data word and an edge word) to a phase control circuit 761 within CDR circuit 756. Phase control circuit 761 compares adjacent data samples (i.e., successively received data samples) within a data word to determine when data signal transitions have taken place, then compares an intervening edge sample with the preceding data sample (or succeeding data sample) to determine whether the edge sample matches the preceding data sample or succeeding data sample. If the edge sample matches the data sample that precedes the data signal transition, then the edge clock is deemed to be early relative to the data signal transition. Conversely, if the edge sample matches the data sample that succeeds the data signal transition, then the edge clock is deemed to be late relative to the data signal transition. Depending on whether a majority of such early/late determinations indicate an early or late edge clock (i.e., there are multiple such determinations due to the fact that each edge word/data word pair includes a sequence of edge and data samples), phase control circuit 761 asserts an up signal (UP) or down signal (DN). If there is no early/late majority, neither the up signal nor the down signal is asserted.

Each of a pair of mix logic circuits 763 and 765 receives a set of phase vectors 767 (i.e., clock signals) from a reference loop circuit 769 and respective timing control signals CT1 and CT2 as noted above. The phase vectors have incrementally offset phase angles within a cycle of a reference clock signal. For example, in one embodiment the reference loop outputs a set of eight phase vectors that are offset from one another by 45 degrees (i.e., choosing an arbitrary one of the phase vectors to have a zero degree angle, the remaining seven phase vectors have phase angles of 45, 90, 135, 180, 225, 270, and 315 degrees). Mix logic circuits 763 and 765 maintain respective phase count values, each of which includes a vector-select component to select a phase-adjacent pair of the phase vectors (i.e., phase vectors that bound a phase angle equal to 360°/N, where N is the total number of phase vectors), and an interpolation component (INT). The interpolation component INT and a pair of phase vectors V1 and V2 are conveyed from each of mix logic circuits 763 and 765 to respective receive-clock mixer circuits 770 and 772. Mixer circuits 770 and 772 mix their respective pairs of phase vectors according to the interpolation component INT to generate complementary edge clock signals and complementary data clock signals that collectively constitute first and second receive-clock signals RCK1 and RCK2, which serve as input clocks for samplers 705 and 710, respectively. Timing control signals CT1 and CT2 facilitate independent control of the timing of clock signals RCK1 and RCK2.

Mix logic circuit 765 increments and decrements the phase count value in response to assertion of the up and down signals, respectively, thereby shifting the interpolation of the selected pair of phase vectors (or, if a phase vector boundary is crossed, selecting a new pair of phase vectors) to retard or advance incrementally the phase of the receive clock signal. For example, when the phase control logic 761 determines that the edge clock leads the data transition and asserts the up signal, mix logic 765 increments the phase count, thereby incrementing the interpolation component INT of the count and causing mixer 772 to incrementally increase the phase offset (retard the phase) of receive-clock signal RCK1. At some point, the phase control signal output begins to dither between assertion of the up signal and the down signal, indicating that edge clock components of the receive clock signal have become phase aligned with the edges in the incoming data signal. Mix logic 763 and mixer 770 are analogous to mix logic 765 and 772, but control the receive clock RCK1 to sampler 705. These redundant circuits are provided so the receive-clock timing to samplers 705 and 710 can be independently adjusted during margin testing.

The equalizer clock generator 759 receives the phase vectors 767 from the reference loop 769 and includes mix logic 774 and an equalizer clock mixer 776, which collectively operate in the manner described above in connection with mix logic 765 and mixer 772. That is, mix logic 774 maintains a phase count value that is incrementally adjusted up or down in response to the up and down signals from the phase control circuit 761. The mix logic selects a phase-adjacent pair of phase vectors 767 based on a vector select component of the phase count. The mix logic then outputs the selected vectors (V1, V2) and interpolation component of the phase count (INT) to the equalizer clock mixer 776. Clock mixer 776 mixes the selected vectors in accordance with the interpolation component of the phase count to generate the equalizer clock signal EQCLK. The equalizer clock signal, which may include complementary component clock signals, is provided to weighting circuit 735 (or another type of equalization circuit) to time the output of equalizing signals onto data input terminal Din.

Figure 8:
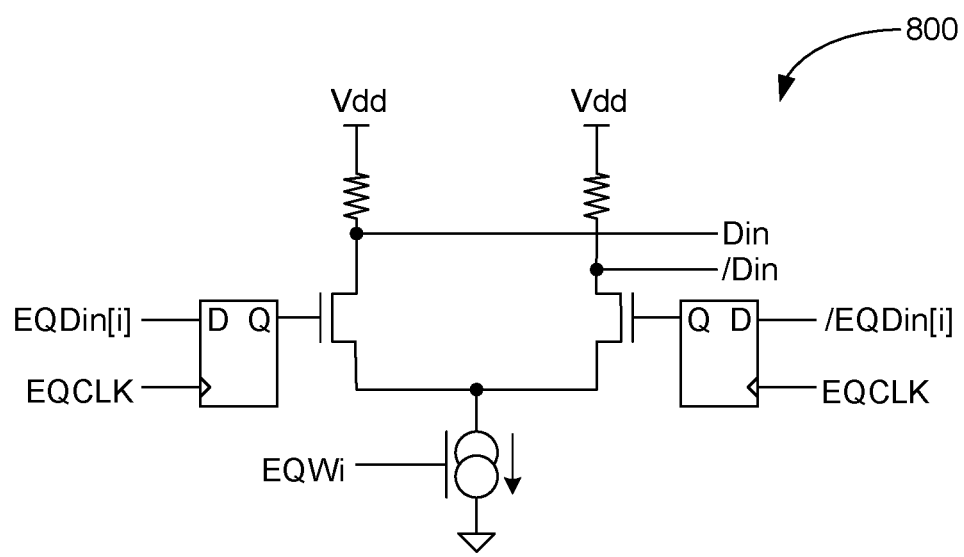
FIG. 8 depicts an embodiment of a buffer 800, which may be used as one of amplifiers 745 in weighting circuit 735 of FIG. 7.

FIG. 8 depicts an embodiment of a buffer 800 that may be used as one of amplifiers 745 in weighting circuit 735 of FIG. 7 in an embodiment in which the data input Din is a two-terminal port receiving differential input signals Din and /Din. Clock signal EQCLK is also a differential signal EQCLK and /EQCLK in this embodiment.

Buffer 800 receives one of five differential feedback signals (EQDin[i] and /EQDin[i]) and the differential clock signal (EQCLK and /EQCLK) from mixer 776. Reference circuit 750 provides a reference voltage EQWi that determines the current through buffer 800, and consequently the relative weight of the selected feedback data bit.

The above-described embodiments are adapted for use in receivers of various types. The embodiment of FIG. 6, for example, is applied to a receiver adapted to receive single-ended input signals, while the embodiments of FIGS. 7 and 8 are applied to receivers adapted to receive complementary signals. These examples are not limiting, as these and other embodiments can be applied to receivers adapted to communicate signals in any of a number of communication schemes, including pulse-amplitude modulated (PAM) signals (e.g., 2-PAM and 4-PAM), which may be used in some embodiments to provide increased data rates.

Figure 9:
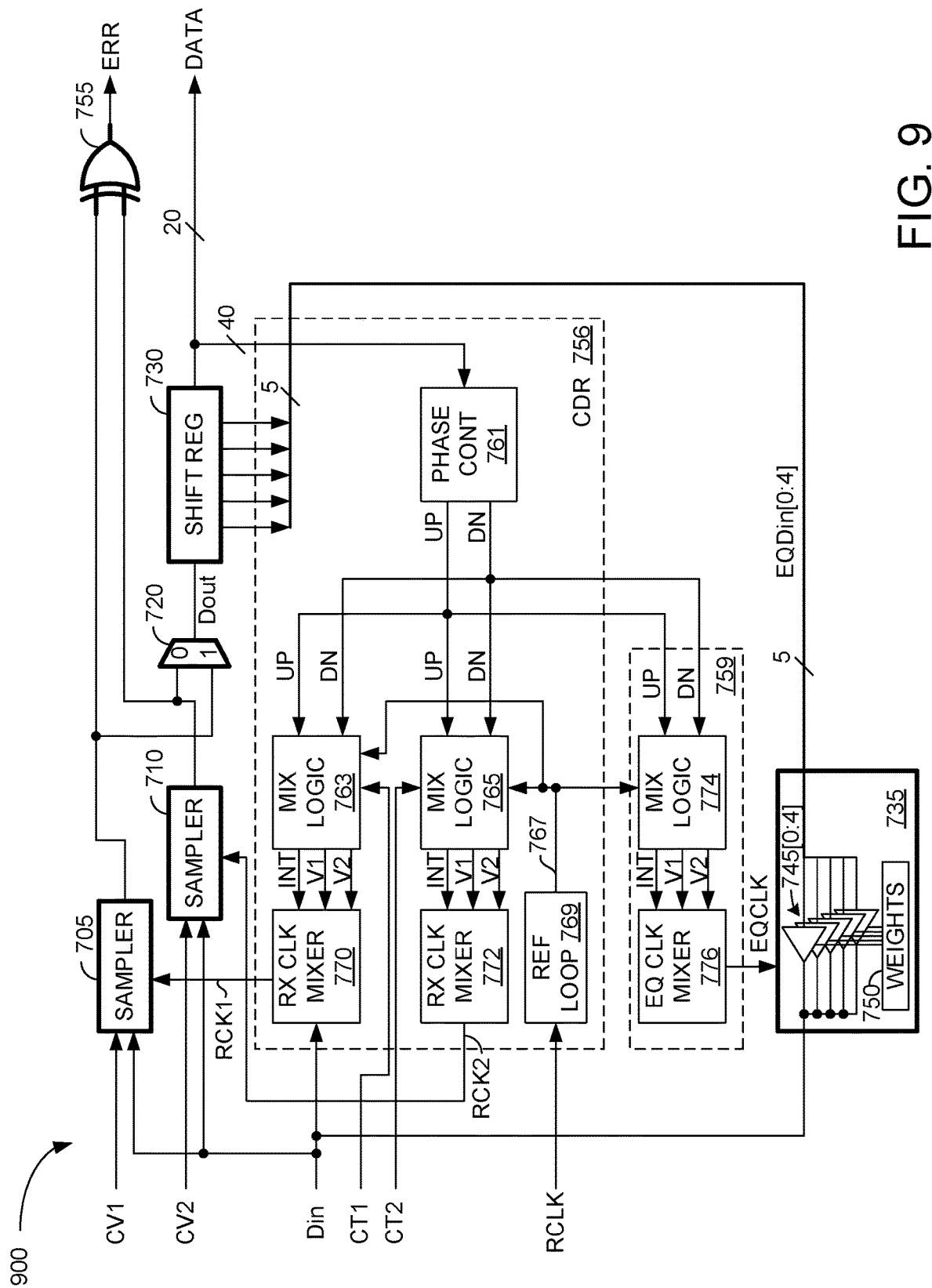
FIG. 9 depicts a receiver 900 in accordance with another embodiment.

FIG. 9 depicts a receiver 900 in accordance with another embodiment. Receiver 900 is similar to receiver 700 of FIG. 7, like-identified elements being the same or similar. Receiver 900 differs from receiver 700 in that receiver 900 omits multiplexer 715 and shift register 725. XOR gate 755 detects errors by comparing the data symbols from samplers 705 and 710. As in receiver 700, both samplers 705 and 710 can be margined in a normal operating mode. The operation of receiver 900 is otherwise similar to that of receiver 700.

Receivers 700 and 900, detailed in connection with respective FIGS. 7 and 9, do not require a predetermined pattern of data (i.e., an "expected" data pattern"), and can thus be margined in the presence of the data patterns received during normal operation. The ability to detect system margins in system and without disrupting the normal flow of data enables accurate in-system margin test. In addition, receivers so equipped can be adapted to dynamically alter system parameters to maintain adequate margins.

Margin Mapping (Shmoo Plots)

Figure 10A:
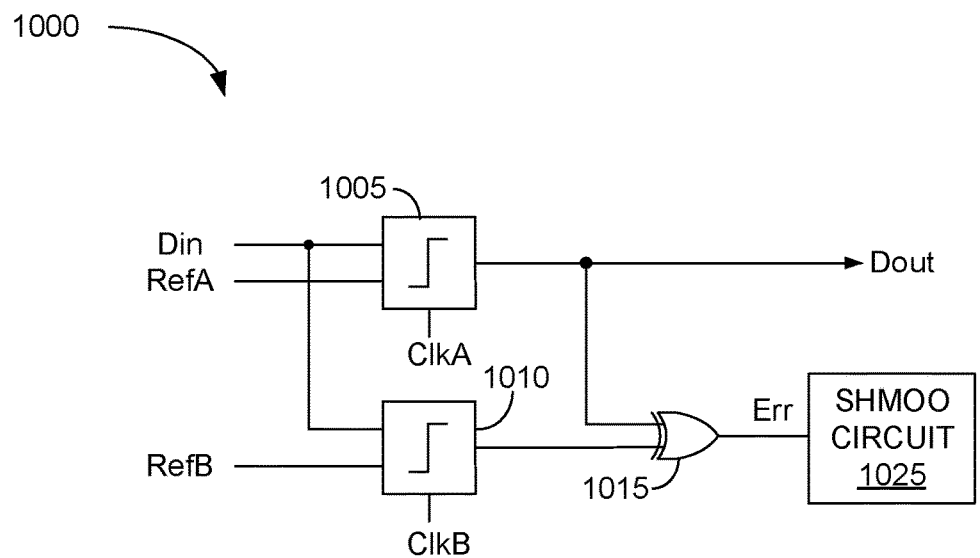
FIG. 10A depicts a receiver 1000, a simplified version of receiver 900 of FIG. 9 used to illustrate margin mapping in accordance with one embodiment.

FIG. 10A depicts a receiver 1000, a simplified version of receiver 900 of FIG. 9 used to illustrate margin mapping in accordance with one embodiment. Receiver 1000 includes two samplers 1005 and 1010, an XOR gate 1015, and a "shmoo" circuit 1025. As used herein, a shmoo circuit is used to develop shmoo data, shmoo data is information that represents margin test results for a given sample point, and a shmoo plot is a graph that represents shmoo data to illustrate how a particular margin test or series of margin tests passes or fails in response to changes in the reference voltage and reference timing. Samplers 1005 and 1010 receive the same input data Din, but have independently adjustable reference voltages RefA and RefB and reference clocks ClkA and ClkB.

Figure 10B:
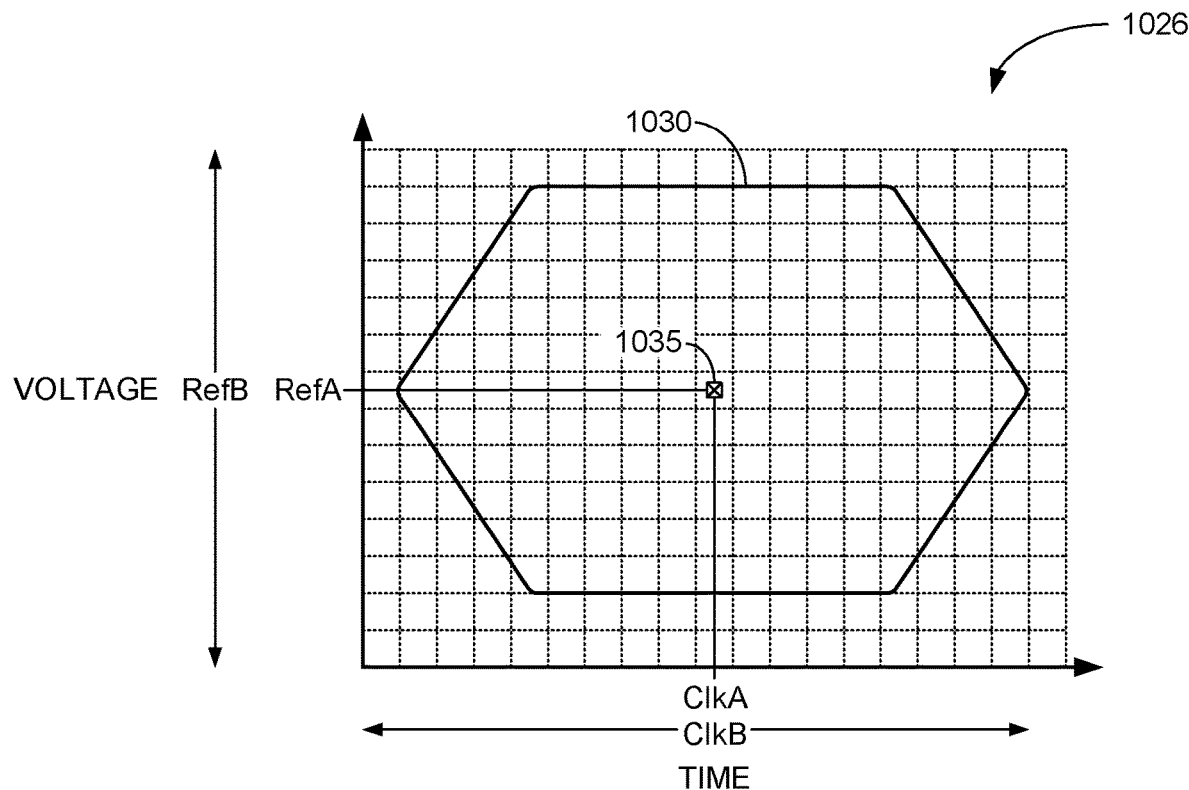
FIG. 10B is a diagram illustrating the relationship between each of samplers 1005 and 1010 of FIG. 10A and a data eye 1030.

FIG. 10B is a diagram 1026 illustrating the relationship between each of samplers 1005 and 1010 and a data eye 1030. Each Cartesian coordinate on diagram 1026 represents a sample coordinate, the vertical (Y) axis being representative of sample voltage and the horizontal (X) axis being representative of sample time. A data point 1035 is centered in data eye 1030 along both axes, and thus represents an ideal sample point for sampler 1005.

To perform a margin test, reference voltage RefB and reference clock ClkB are adjusted along their respective Y and X axes to sample data symbols at each coordinate one or more times to probe the boundaries of eye 1030. Margins are detected when XOR gate 1015 produces a logic one, indicating that sampler 1010 produced different data than sampler 1005. Shmoo circuit 1025 correlates errors with the respective reference voltage RefB and clock signal ClkB for sampler 1010 and stores the resulting X-Y coordinates. Care should be taken to ensure proper clock-domain crossing of the two reference clocks ClkA and ClkB to prevent data samplers 1005 and 1010 from sampling different data eyes (e.g., to prevent respective samplers from sampling different ones of two successive data symbols). Signals RefB and ClkB can be interchanged with respective signals RefA and ClkA in FIG. 10B to margin sampler 1010. Methods and circuits for adjusting clock phases and reference voltages are well known in the art, and are therefore omitted here for brevity.

Figure 10C:
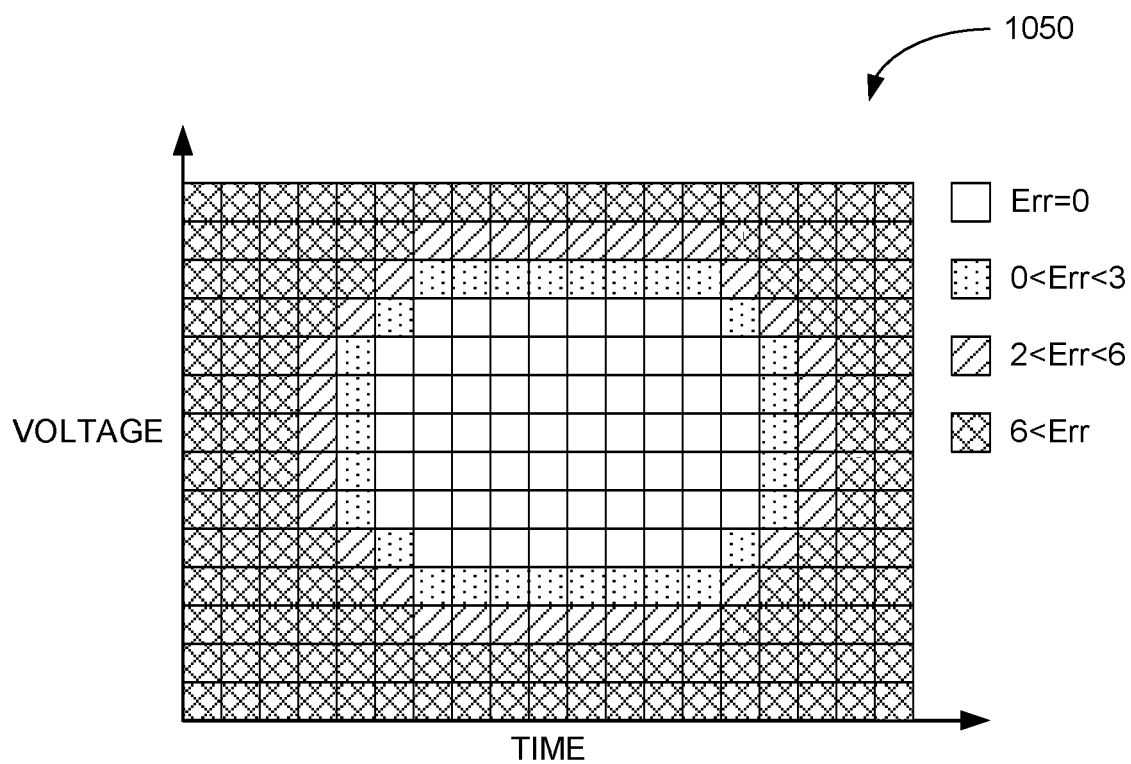
FIG. 10C depicts a shmoo plot 1050 graphically depicting an illustrative margin test in accordance with one embodiment.

FIG. 10C depicts a shmoo plot 1050 graphically depicting an illustrative margin test in accordance with one embodiment. During margin test, reference voltage RefB and reference clock ClkB are adjusted to sample incoming data at each voltage/time square (sample point) represented in FIG. 10C. The number of errors encountered over a fixed time is then recorded for each sample coordinate. The resulting plot for a given receiver will bear a resemblance to plot 1050, though will typically be less uniform than this illustration.

Plot 1050 can be used in a number of ways. Returning to FIG. 10B, for example, data point 1035 is depicted in the center of eye 1030, an ideal circumstance. Plot 1050 can be used to precisely locate the true center of eye 1030. Once this center is known, reference voltage RefA and reference clock ClkA can be adjusted as needed to maximize the margins for sampler 1005.

Plot 1050 can also be used to establish different margins depending upon the allowable bit-error rate (BER) for the communication channel of interest. Different communication schemes afford different levels of error tolerance. Communications channels can therefore be optimized using margin data gathered in the manner depicted in FIG. 10C. For example, an error-intolerant communication scheme might require the zero-error margin, whereas a more tolerant scheme might be afforded the larger margin associated with a small number of errors per unit time.

Adaptive Margining

Some embodiments detect and maintain margins without storing the shmoo data graphically depicted in FIG. 10C. One or more additional samplers can be used to probe the margins periodically or dynamically, and the sampler used to obtain the sampled data can be adjusted accordingly. In one embodiment, for example, the reference voltage and clock of the sampler used to obtain the sampled data are adjusted in response to perceived errors to maintain maximum margins. With reference to FIG. 10A, sampler 1010 can periodically probe the high and low voltage margins and then set reference voltage RefA between them. With reference voltage RefA thus centered, the process can be repeated, this time adjusting the phase of reference clock ClkB to detect the timing margins. The phase of reference clock ClkA can then be aligned in eye 1030. In other embodiments, additional samplers can simultaneously probe different margins of eye 1030. Dynamic margining systems in accordance with these embodiments thus automatically account for time-variant system parameters (e.g., temperature and supply-voltage).

Figure 11:
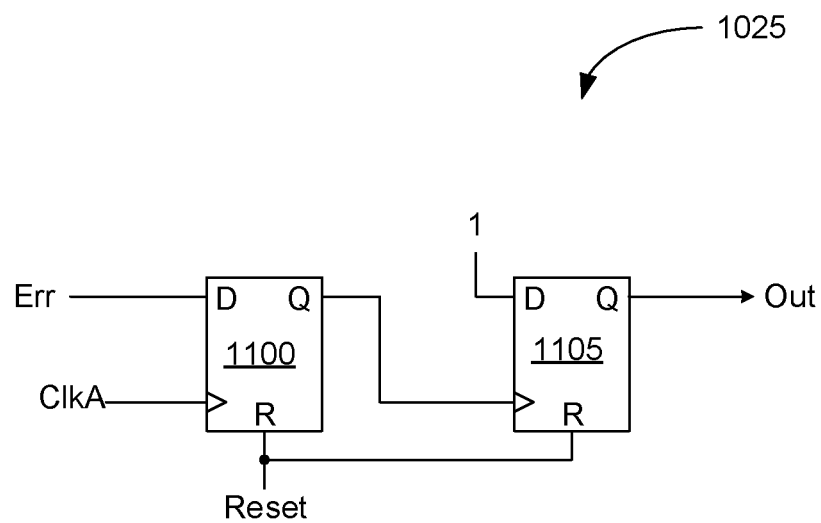
FIG. 11 details an embodiment of shmoo circuit 1025 of FIG. 10A.

FIG. 11 details an embodiment of shmoo circuit 1025 of FIG. 10A. Shmoo circuit 1025 includes a pair of flip-flops 1100 and 1105. Flip-flop 1100 synchronizes error signal Err with a clock signal Clk. Flip-flop 1105, a ones detector, produces a logic-one output signal OUT in response to any logic ones received from flip-flop 1100. In operation, both flip-flops are reset to zero and error signal Err is monitored for a desired number of data samples at a given timing/voltage setting. Flip-flop 1100 captures any logic-one error signals Err, and ones detector 1105 transitions to logic one and remains there in response to any logic ones from flip-flop 1100. A logic one output signal OUT is therefore indicative of one or more error signals received in the sample period. In other embodiments, flip-flop 1105 is replaced with a counter that counts the number of captured errors for a given period. The number and duration of the sample periods can be changed as desired.

Figure 12:
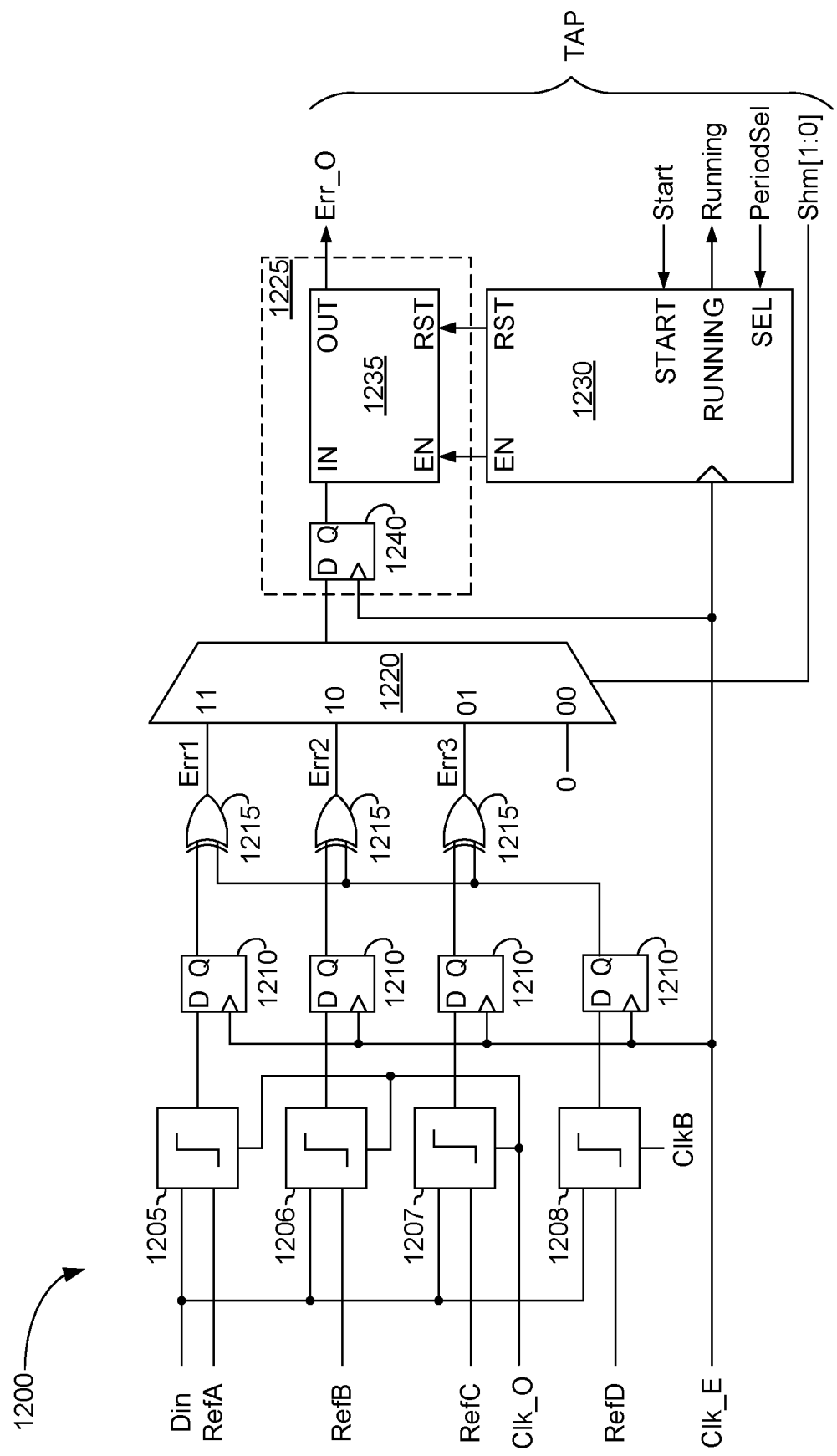
FIG. 12 details a receiver 1200 in accordance with another embodiment adapted to accommodate margin shmooing.

FIG. 12 details a double-data-rate (DDR) receiver 1200 in accordance with another embodiment adapted to accommodate margin shmooing. Receiver 1200 includes four data samplers 1205-1208 timed to an odd-phase clock Clk_O, four respective flip-flops 1210 timed to an even-phase clock Clk_E, three error-detecting XOR gates 1215, a multiplexer 1220, error-capturing logic 1225, and shmoo control logic 1230. An external tester (not shown) issues test instructions and receives margin-test results via a test-access port TAP. In another embodiment, the outputs from the three flip-flops 1210 following samplers 1205, 1206, and 1207 connect directly to corresponding inputs of multiplexer 1220. A single XOR gate on the output side of multiplexer 1220 then compares the selected sampler output signal with the output from sampler 1208.

As is conventional, DDR receivers receive data on two clock phases: an odd clock phase Clk_O and an even clock phase Clk_E. Receiver 1200 represents the portion of a DDR receiver that captures incoming data using the odd clock phase Clk_O. Signals specific to only one of the clock phases are indicated by the suffix "_E" or "_O" to designate an even or odd phase, respectively. Samplers 1205, 1206, and 1207 are portions of the "odd" circuitry. Similar samplers are provided for the even circuitry but are omitted here for brevity. The odd and even clock phases of a DDR high-speed serial input signal can be shmooed separately or in parallel.

Receiver 1200 may enter a shmoo mode at the direction of an external tester and/or under the control of another circuit internal or external to the receiver. Shmoo select signals Shm[1:0] then cause multiplexer 1220 to connect the output of one of XOR gates 1215 to the input of error-capturing logic 1225. The following example assumes multiplexer 1220 selects error signal Err1 to perform margin tests on sampler 1205. Margin tests for the remaining samplers 1206 and 1207 are identical.

The external tester initiates a shmoo test cycle by issuing a rising edge on terminal Start. In response, control logic 1230 forces a signal Running high and resets a ones detector 1235 within error-capturing logic 1225 by asserting a reset signal RST. When signal Start goes low, control logic 1230 enables ones detector 1235 for a specified number of data clock cycles—the "shmoo-enable interval"—by asserting an enable signal EN. When period-select signal PeriodSel is zero, the number of data clock cycles in the shmoo-enable interval is 160 (320 symbol periods). When signal PeriodSel is one, the number of data clock cycles in the shmoo-enable interval is 128 (256 symbol periods).

The lower-most sampler 1208, in response to control signals from the external tester, shmoos the margins for the sampler 1205 selected by multiplexer 1220. The shmooing process is similar to that described above in connection with FIGS. 10A, 10B, and 10C. The process employed by receiver 1200 differs slightly, however, in that receiver 1200 takes advantage of the presence of even clock Clk_E and flip-flops 1210 to retime the input signals to XOR gates 1215. Even clock Clk_E is 180 degrees out of phase with respect to odd clock Clk_O. Clock signal ClkB can therefore be varied up to 90 degrees forward or backward with respect to odd clock Clk_O without fear of sampling different data symbols with the selected sampler 1205 and sampler 1208.

The upper-most XOR gate 1215 produces a logic one if, during the shmoo-enable interval, one or more bits from sampler 1205 mismatches the corresponding bit from sampler 1208. A flip-flop 1240 captures and conveys this logic one to ones detector 1235. At the end of the shmoo-enable interval, controller 1230 brings signal Running low and holds that state of signal Err_O. A logic one error signal Err_O indicates to the tester that at least one mismatch occurred during the shmoo-enable interval, whereas a logic zero indicates the absence of mismatches.

The shmoo interval can be repeated a number of times, each time adjusting at least one of reference voltage RefD and clock CLKB, to probe the margins of input data Din. A shmoo plot similar to that of FIG. 10B can thus be developed for sampler 1205. This process can then be repeated for the remaining samplers.

Control logic 1230 does not interfere with the normal operation of receiver 1200, so shmooing can be performed for any type of input data Din. Thus, receiver 1200 allows for the capture of real data eyes under various operating conditions, and can be used to perform in-system margin tests.

Other embodiments repeat the process a number of times for each of an array of voltage/time data points to derive margin statistics that relate the probability of an error for various sample points within a given data eye. Still other embodiments replace ones detector 1235 with a counter that issues an error sum count for each shmoo-enable interval.

In one embodiment, receiver 1200 samples four-level, pulse-amplitude-modulated (4-PAM) signals presented on terminal Din, in which case each of samplers 1205-1207 samples the input data symbols using a different reference voltage level. In general, the methods and circuits described herein can be applied to N-PAM signaling schemes, where N is at least two. Such systems typically include N-1 samplers for each data input node.

Figure 13:
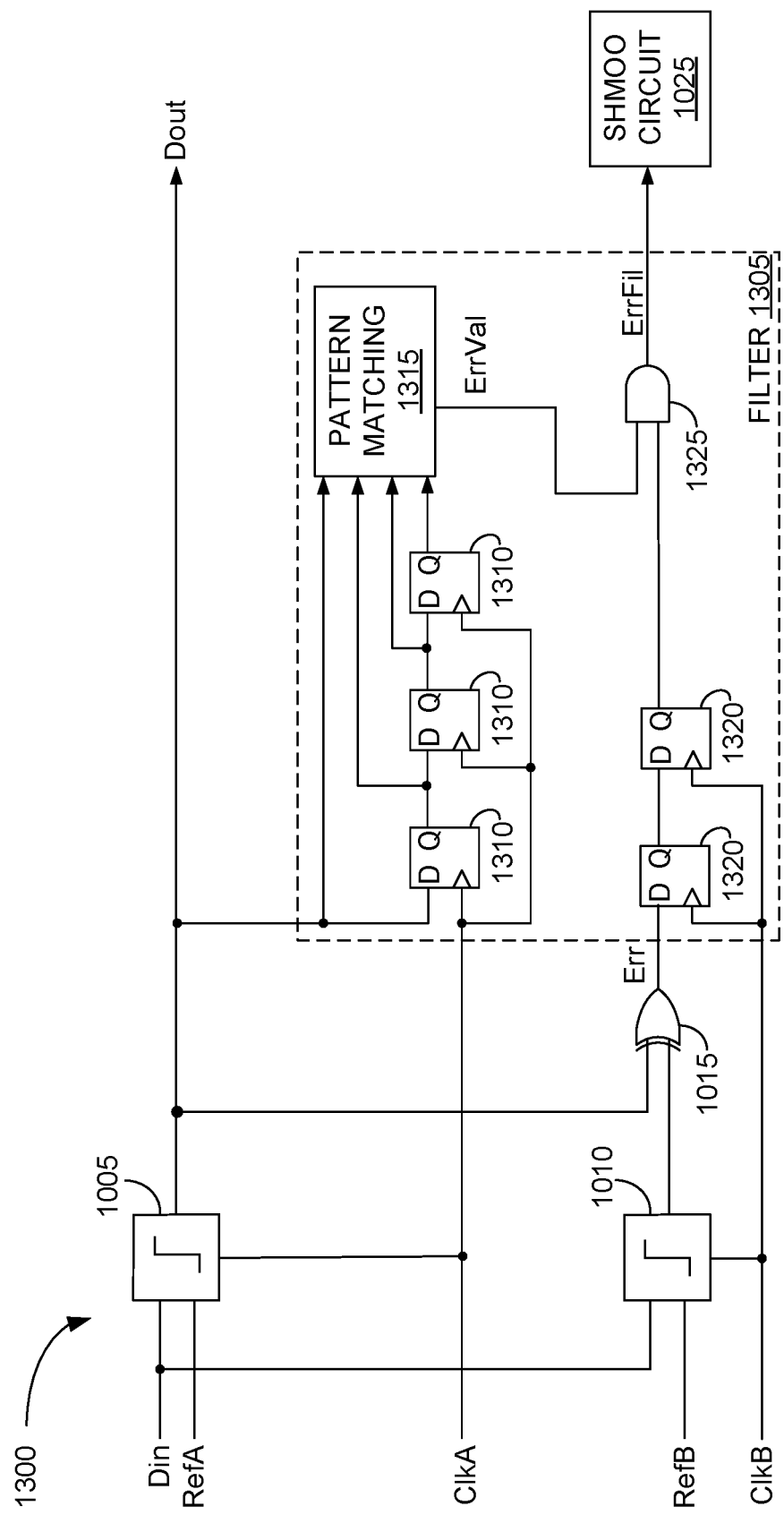
FIG. 13 depicts a receiver 1300 that supports error filtering in accordance with another embodiment.

FIG. 13 depicts a receiver 1300 that supports error filtering in accordance with another embodiment. Receiver 1300 is similar to receiver 1000 of FIG. 10A, like-numbered elements being the same or similar. Receiver 1300 differs from receiver 1000 in that receiver 1300 includes data filter 1305 that allows receiver 1300 to shmoo particular data patterns. This is a benefit, as a receiver's margin may differ for different data patterns, due to ISI for example. Data filter 1305 allows receiver 1300 to perform pattern-specific margin tests to better characterize receiver performance.

Data filter 1305 includes a series of N data registers 1310 that provide a sequence of data samples Dout to a pattern-matching circuit 1315. In this case N is three, but N may be more or fewer. Data filter 1305 also includes a series of M (e.g., two) error registers 1320 that convey a sequence of error samples to an input of an AND gate 1325. AND gate 1325 only passes the error signals from registers 1320 if pattern-matching circuit 1315 asserts a error-valid signal ErrVal on the other input of AND gate 1325. Pattern-matching circuit 1315 asserts signal ErrVal only if the pattern presented by registers 1310 matches some predetermined pattern or patterns stored in pattern-matching circuit 1315. In one embodiment external test circuitry (not shown) controls the patterns provided by matching circuit 1315. Other embodiments support in-system testing with one or more patterns provided internally (e.g., on the same semiconductor chip).

Measuring the Impact of DFE Settling Time

A number of the foregoing embodiments explore signal margins using two samplers operating in parallel to receive the same incoming data stream. Depending upon their roles in the margining, one of the samplers can be termed the "main sampler" and the other the "roving sampler." In the embodiment of FIG. 9, for example, sampler 705 can be used to capture the incoming signal Din while the voltage and timing of sampler 710 is adjusted to explore the voltage and timing margins of the incoming signal.

At high data rates the delay through sampler and DFE path may be such that the DFE feedback signal settles just in time to correct for ISI before the next sample instant. Using the example of FIG. 9, and assuming sampler 705 is the main sampler and sampler 710 is the roving sampler, advancing the timing of the roving clock signal RCK2 with respect to clock signal RCK1 may not alter the timing of feedback signal EQDin[0:4] or the delay through weighting circuit 735, and consequently may not alter the instant in time at which the DFE feedback is applied to the input nodes of the samplers. Margin measurements based upon such timing changes may therefore not provide an accurate picture of symbol margins.

Figure 14:
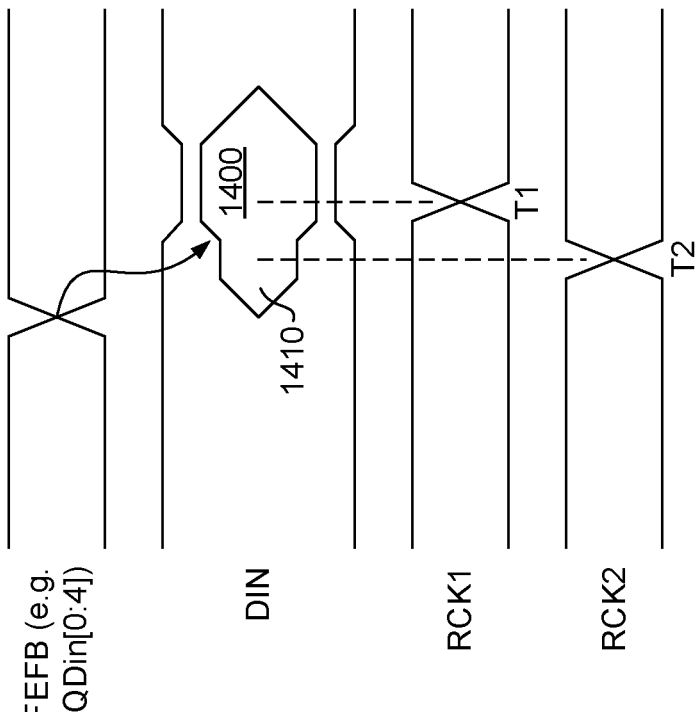
FIG. 14 is a waveform diagram illustrating that signal eye 1400 further opens after a DFE feedback signal settles.

FIG. 14 illustrates the point being made in the last paragraph. A signal eye 1400 opens to an extent after feedback signal EQDin[0:4] settles to the correct value. The settling occurs prior to the sample time T1, and so eye 1400 is advantageously opened to provide additional voltage margin prior to sampling by the main sampler 705. The delayed application of the feedback signal produces a relatively narrow portion 1410 of eye 1400.

Figure 15:
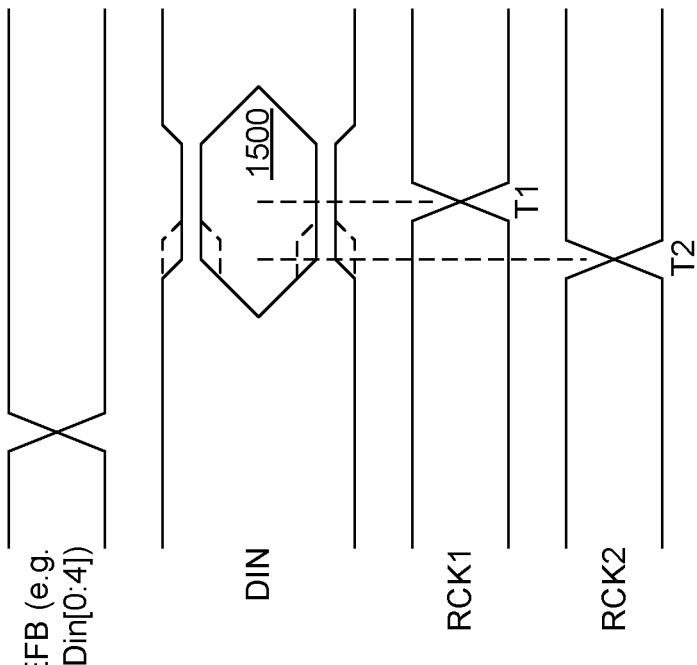
FIG. 15 is a waveform diagram illustrating an effect of advancing the DFE feedback with respect to sample timing.

The timing of the roving sampler 710, provided by clock RCK2, can be advanced with respect to fixed clock RCK1 to explore the narrow portion 1410 of eye 1400. This is advantageous for some margin measurements, as the narrow portion of the eye may be of interest. In practice, however, the timing of the DFE feedback typically advances with the timing of the RCK1. If, for example, the RCK1 signal were to be advanced to time T2, then the DFE feedback signal would settle earlier. In that case it may be incorrect to assume that the narrow portion 1410 (observed when RCK1 is at time T1) provides an accurate assessment of the margin of sampler 705 at time T2. One embodiment thus allows DFE feedback timing to be independent of the sample clock. With reference to FIG. 15, if DFE feedback EQDin[0:4] were to settle well before the sample instant of roving clock RCK2, then eye 1500 would open earlier than eye 1400 of FIG. 14. Roving clock RCK2 could therefore be used to explore the early portion of a relatively open eye 1500 at e.g. time T2. This decoupling of the feedback and sample timing provides additional measures of signal margin that can be used to better assess the true signal margins.

Figure 16:
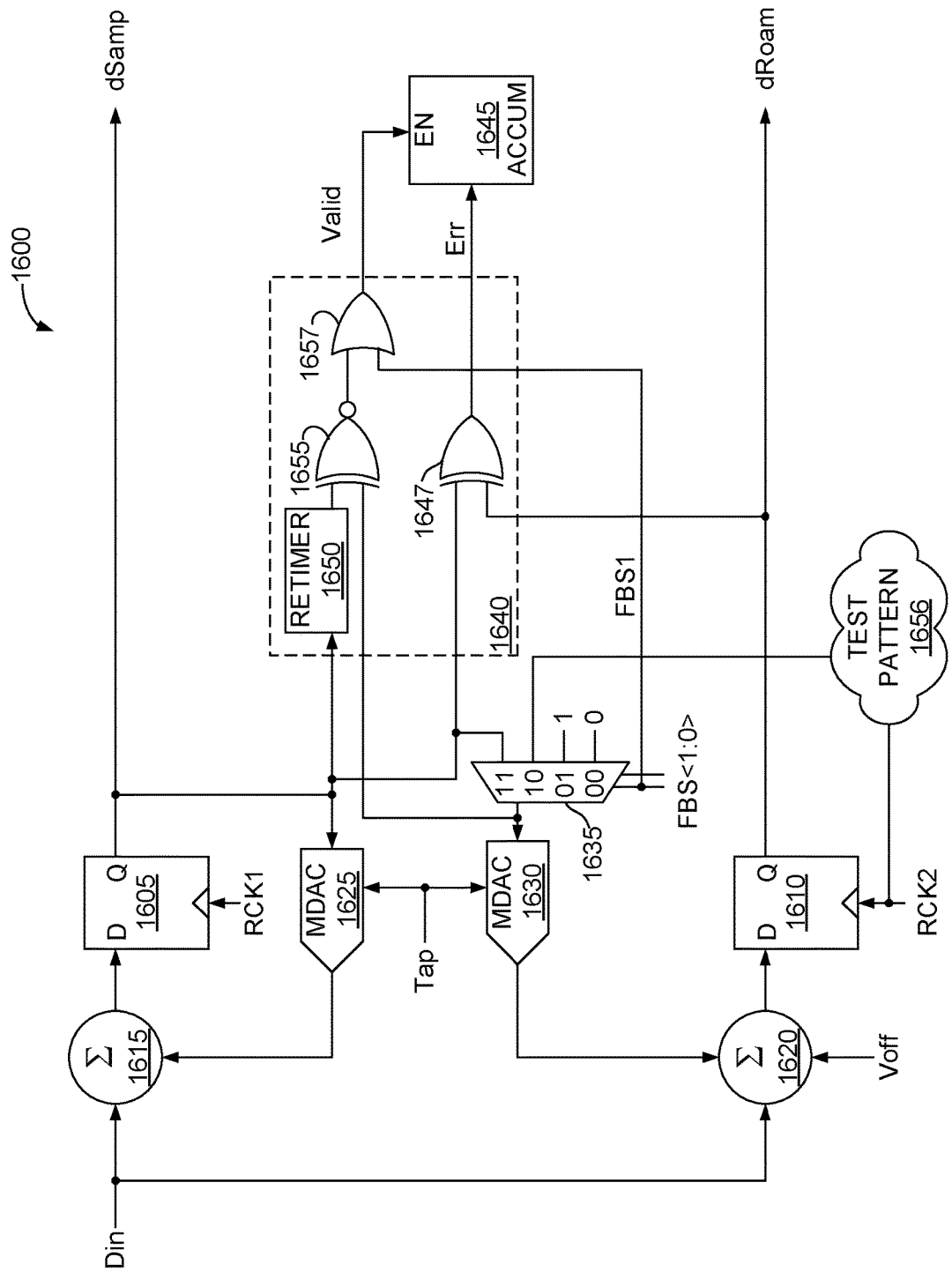
FIG. 16 depicts a receiver 1600 in accordance with an embodiment that decouples the feedback and sample timing to provide additional measures of signal margin.

FIG. 16 depicts a receiver 1600 in accordance with an embodiment that decouples the feedback and sample timing to provide additional measures of signal margin. Receiver 1600 includes first and second data samplers 1605 and 1610, the data input ports of which are coupled to a common data input terminal Din via a respective one of first and second summing amplifiers, or "summers," 1615 and 1620. Summer 1615 is part of a feedback path for sampler 1605 that additionally includes a multiplying digital-to-analog converter (MDAC) 1625. Summer 1615 and MDAC 1625 are together a single-tap DFE, though additional taps may also be included. A tap weight signal Tap may be adjusted to alter the weight of the feedback signal applied by MDAC 1625. Summer 1620 is part of a feedback path for sampler 1610 that additionally includes a multiplying MDAC 1630 and a multiplexer 1635. Summer 1620 and MDAC 1630 are together a single-tap DFE, though additional taps may also be included. MDAC 1630 shares tap weight signal Tap with MDAC 1625 in this embodiment.

Multiplexer 1635 applies expected, time-shifted values of the incoming symbols to facilitate margin testing that explores the assumption that DFE feedback may settle over a range of times with respect to sample clock RCK1. Multiplexer 1635, an expected-data source, alternatively applies:

1. a sample data stream dSample from the data output port of sampler 1605 (FBS<1:0>=11);
2. a predetermined test pattern (FBS<1:0>=10);
3. a steady-state voltage representative of a logic one (FBS<1:0>=01); or;
4. a steady-stage voltage representative of a logic zero (FBS<1:0>=00).

Multiplexer 1635 can also include additional inputs, such as to the sample data stream dRoam output from sampler 1610.

Comparison circuit 1640 identifies errors by comparing the output signals from sampler 1605 and roving sampler 1610. An accumulator 1645, when enabled via the assertion of a valid signal Valid, increments for each mismatch sensed by an XOR gate 1647 within comparison circuit 1640 to provide a measure of the BER. As detailed below, some test configurations periodically make incorrect assumptions about the values of preceding data symbols. These incorrect assumptions may lead to false error signals, so comparison circuit 1640 includes a data filter that prevents accumulator 1645 from incrementing in response to potentially false error signals. In this embodiment, the data filter includes a retimer 1650 and an XNOR gate 1655. Some test configurations do not require data filtering, so an OR gate 1657 is provided to disable the filtering.

Assume feedback-select signal FBS<1:0> to multiplexer 1635 is set to "11" to direct the output signal from sampler 1605 to the input of MDAC 1630. With reference to FIG. 14, the timing of the roving clock signal RCK2 can be varied, as can the offset voltage Voff to summer 1620, to explore the boundaries of eye 1400. To a first approximation, the DFE feedback through MDAC 1630 and summer 1620 will not shift in time with roving clock RCK2, so such a margin test will show the narrow portion 1410 of eye 1400. Bit FBS1 is set to one in this mode, so OR gate 1657 holds valid signal Valid high. Error signal Err is therefore asserted each time data sample dSamp mismatches roaming data sample dRoam. Accumulator 1645, constantly enabled by valid signal Valid, accumulates the bit errors. Though not shown, accumulator 1645 is synchronized to the incoming data.

Assume feedback-select signal FBS<1:0> to multiplexer 1635 is set to "00" to direct a steady-state logic zero to the input of MDAC 1630. This is akin to always assuming the prior received data symbol was representative of a logic zero, and providing appropriate DFE feedback based upon that assumption. Such a scenario is depicted in FIG. 15 as feedback signal EQDin[0:4] having settled well before receipt of the current symbol 1500. In that case, and assuming the prior received symbol was indeed representative of a logic zero, the opening of the received eye occurs earlier than if the receiver had to await resolution of the preceding symbol. The first portion of eye 1500 of FIG. 15 is thus more open than eye 1400 of FIG. 14. The timing of the roving clock signal RCK2 and offset voltage Voff can then be varied to explore the boundaries of the widened eye 1500.

Eye 1500 is only widened when the assumption about the prior data symbol is correct; otherwise, the DFE feedback tends to degrade the incoming signal. Comparison circuit 1640 is therefore adapted to disable accumulator 1645 when the assumption about the preceding data symbol is incorrect. Retimer 1650 delays output data signal dSamp by one symbol time so that the output to XNOR gate 1655 is the resolved prior data sample. XNOR gate 1655 thus only outputs a logic one if the selected symbol from multiplexer 1635 matches the prior data symbol, and is consequently the correct level for the DFE feedback signal. Select signal FBS<1:0> can be set to "01" to perform the same test based upon the assumption that the preceding bit was a logic one.

In effect, the applied zero or one is an expected, time-shifted value representative of a corresponding prior input data symbol. The timing of the applied DFE feedback can thus be provided independently of either or both of the sample clock signals RCK1 and RCK2.

Select signal FBS<1:0> can be set to "10" to provide a test pattern from source 1656. The test pattern might be, for example, an identical, time-shifted version of the known data applied to input terminal Din. The time-shift of the expected data can be varied with the roving clock signal RCK2, though in other embodiments the timing of the test pattern, and consequently the applied DFE feedback for the roving sampler, can be controlled separately from the roving and data clocks. Data filtering is not used in the depicted embodiment when the DFE feedback for MDAC 1630 is based upon sampled data dSamp or a test pattern.

Some of the foregoing embodiments employ an additional sampler to probe the margins of a given data input. Some receiver architectures already include the requisite additional sampler, to support additional signaling modes, for example. Other embodiments may be adapted to include one or more additional "monitor" samplers.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. Moreover, unless otherwise defined, terminals, lines, conductors, and traces that carry a given signal fall under the umbrella term "node." In general, the choice of a given description of a circuit node is a matter of style, and is not limiting. Likewise, the term "connected" is not limiting unless otherwise defined. Some components are shown directly connected to one another while others are shown connected via intermediate components. In each instance, the method of interconnection establishes some desired electrical communication between two or more circuit nodes, or terminals. Such communication may often be accomplished using a number of circuit configurations, as will be understood by those of skill in the art. Furthermore, only those claims specifically reciting "means for" or "step for" should be construed in the manner required under the sixth paragraph of 35 U.S.C. § 112. Therefore, the spirit and scope of the appended claims should not be limited to the foregoing description.

What is claimed is:

1. A receiver comprising:
   a data input terminal to receive a stream of input data symbols;
   a first data sampler with first decision-feedback equalization to sample the input data symbols and output a first series of samples, the first decision-feedback equalization based on feedback of the first series of samples;
   a second data sampler with second equalization to sample the input data symbols and output a second series of samples, the second equalization based on an assumption for each preceding data symbol absent consideration of any of the preceding data symbols; and
   a comparison circuit to compare the first series of samples with the assumptions of preceding data symbols.

2. The receiver of claim 1, the comparison circuit to further compare the first series of samples with the second series of samples.

3. The receiver of claim 1, wherein the second equalization is alternatively based on the first series of samples.

4. The receiver of claim 1, wherein the second equalization is based on a test pattern different from the first series of samples.

5. The receiver of claim 1, further comprising a summing amplifier and a digital-to-analog converter to perform the first decision-feedback equalization.

6. The receiver of claim 5, wherein the digital-to-analog converter is a one-bit converter.

7. The receiver of claim 5, further comprising a second summing amplifier and a second digital-to-analog converter to perform the second equalization.

8. The receiver of claim 7, wherein the second summing amplifier includes an input to receive an offset voltage.

9. The receiver of claim 1, the second equalization further including a multiplexer to selectively apply the first series of samples as feedback to the second data sampler.

10. The receiver of claim 9, the multiplexer to selectively apply a steady-state to the second data sampler.

11. A receiver comprising:
    a data input terminal to receive a stream of input data symbols;
    a first data sampler with first decision-feedback equalization to sample the input data symbols and output a first series of samples, the first decision-feedback equalization based on feedback of the first series of samples;
    a second data sampler with second decision-feedback equalization to sample the input data symbols and output a second series of samples, the second decision-feedback equalization based on an assumption for each preceding data symbol absent consideration of the preceding data symbols;
    a comparison circuit to compare the first series of samples with the assumptions of preceding data symbols, and to compare the first series of samples with the second series of samples; and an error accumulator coupled to the comparison circuit to accumulate an error signal when a given sample in the first series of samples matches the assumption of the preceding data symbol and does not match a corresponding sample in the second series of samples.

12. A receiver comprising:
a data input terminal to receive a stream of input data symbols;
a first data sampler with first decision-feedback equalization to sample the input data symbols and output a first series of samples, the first decision-feedback equalization based on feedback of the first series of samples;
a second data sampler with second equalization to sample the input data symbols and output a second series of samples, the second equalization based on an assumption for each preceding data symbol absent consideration of any of the preceding data symbols; and
means for comparing the first series of samples with the assumptions of preceding data symbols.

13. The receiver of claim 12, further comprising means for comparing the first series of samples with the second series of samples.

14. The receiver of claim 12, the second equalization further including means for selectively applying the first series of samples as feedback to the second data sampler.

15. A receiver comprising:
a data input terminal to receive a stream of input data symbols;
a first data sampler with first decision-feedback equalization to sample the input data symbols and output a first series of samples, the first decision-feedback equalization based on feedback of the first series of samples;
a second data sampler with second equalization to sample the input data symbols and output a second series of samples, the second equalization based on an assumption for each preceding data symbol absent consideration of the preceding data symbols;
means for comparing the first series of samples with the assumptions of preceding data symbols;
means for comparing the first series of samples with the second series of sample; and
means for accumulating an error signal when a given sample in the first series of samples matches the assumption of the preceding data symbol and does not match a corresponding sample in the second series of samples.

* * * * *